(12) United States Patent
Kim et al.

(10) Patent No.: US 9,231,564 B2
(45) Date of Patent: Jan. 5, 2016

(54) GATE ON ARRAY DRIVER UNIT, GATE ON ARRAY DRIVER CIRCUIT, AND DISPLAY DEVICE

(71) Applicant: BOE TECHNOLOGY GROUP CO., LTD., Beijing (CN)

(72) Inventors: Taegyu Kim, Beijing (CN); Ying Wang, Beijing (CN); Pilseok Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/125,824

(22) PCT Filed: Nov. 12, 2012

(86) PCT No.: PCT/CN2012/084476
§ 371 (c)(1),
(2) Date: Dec. 12, 2013

(87) PCT Pub. No.: WO2013/127193
PCT Pub. Date: Sep. 6, 2013

(65) Prior Publication Data
US 2014/0132491 A1 May 15, 2014

(30) Foreign Application Priority Data

Feb. 29, 2012 (CN) .......................... 2012 1 0050073

(51) Int. Cl.
*H03K 3/01* (2006.01)
*G11C 19/28* (2006.01)
*G09G 3/32* (2006.01)

(52) U.S. Cl.
CPC ................ *H03K 3/01* (2013.01); *G09G 3/3225* (2013.01); *G09G 3/3266* (2013.01); *G11C 19/28* (2013.01); *G09G 2310/0286* (2013.01)

(58) Field of Classification Search
CPC ...... G11C 19/28; G11C 19/184; G11C 19/00; G09G 2310/0286; G09G 3/3677; G09G 2300/0842; G09G 3/3233; G09G 2300/0819; G09G 2320/043; G09G 3/30; G09G 3/3266; G09G 3/3648; G09G 3/3688; G09G 2310/0267; G09G 2310/0289; G09G 3/3674; G09G 2310/061; G09G 2300/0408; G09G 2300/0417; G09G 2310/0205; G09G 2310/0248; G09G 3/20; G09G 2310/08; G09G 2300/041
USPC ................................ 345/80; 327/108; 377/64
See application file for complete search history.

(56) References Cited

U.S. PATENT DOCUMENTS

2008/0219401 A1*  9/2008  Tobita .............................. 377/79
2010/0141642 A1*  6/2010  Furuta et al. ................... 345/213
2011/0122988 A1*  5/2011  Miyayama et al. ............. 377/64

FOREIGN PATENT DOCUMENTS

CN         1553456 A      12/2004
CN       101221818 A       7/2008

(Continued)

OTHER PUBLICATIONS

International Search Report mailed Feb. 14, 2013; PCT/CN2012/084476.

(Continued)

*Primary Examiner* — Saiful A Siddiqui
(74) *Attorney, Agent, or Firm* — Ladas & Parry LLP

(57) ABSTRACT

A gate on array driver unit, a gate on array driver circuit, and a display device. The gate on array driver unit comprises an input sampling unit, an output unit, a reset unit, and a storage capacitor. The storage capacitor is connected at a first end thereof to a gate electrode driving signal output end of the present stage. The input sampling unit is connected to a second end of the storage capacitor, and, under the control of a gate electrode driving signal of a previous stage of the gate on array driver unit, precharges the storage capacitor and allows the gate driving signal of the present stage to sample the input signal. The output unit is connected to the second end of the storage capacitor, and, when the input sampling unit completes the precharging of the storage capacitor, controls the output of the gate electrode driving signal of the present stage. The reset unit, under the control of the gate electrode driving signal of the gate on array driver unit of a next stage, resets the gate electrode driving signal of the present stage. Employment of the gate on array driver unit allows for reduced circuit layout area for the gate on array driver circuit.

3 Claims, 4 Drawing Sheets

(56) References Cited

FOREIGN PATENT DOCUMENTS

| CN | 101377595 A | 3/2009 |
|---|---|---|
| CN | 101882470 A | 11/2010 |
| CN | 101939791 A | 1/2011 |
| CN | 102708795 A | 10/2012 |
| CN | 102708796 A | 10/2012 |

OTHER PUBLICATIONS

First Chinese, Office Action dated Sep. 29, 2013; Appln. No. 201210050073.2.

* cited by examiner

GATE ON ARRAY DRIVER UNIT, GATE ON ARRAY DRIVER CIRCUIT, AND DISPLAY DEVICE

TECHNICAL FIELD

The present invention relates to a field of organic light display, and in particularly to a row driving unit on array substrate, a gate driver on array and a display apparatus.

BACKGROUND

An Organic Light-Emitting Diode (OLED) has been applied to displays with a high performance more and more because of its advantages such as a high luminance, a wide angle of view, a rapid response speed and so one. Traditional passive matrix OLED requires shorter driving time for a single pixel as its display size becomes bigger, therefore an instantaneous current is increased and a power consumption is also increased. Further, an application with a big current would cause a voltage drop on an ITO line too great and an operation voltage at the OLED too high, which may decrease its efficiency in turn. As compared, an active matrix OLED may settle these problem well by scanning input OLED currents progressively with switching transistors.

A gate driver on array (Gate on Array) integrates a gate switching circuit into the array substrate to realize a high integration degree of the driving circuit, and may reduce a cost on two sides of saving materials and reducing process steps.

SUMMARY

A major object of the embodiments of the present disclosure is to provide a row driving unit on array substrate, a gate driver on array and a display apparatus, in order to reduce a layout area of wirings in the gate driver on array.

In view of above, the embodiments of the present disclosure provide a row driving unit on array substrate, comprising an input sampling unit, an outputting unit, a resetting unit and a storage capacitor, wherein:

a first end of the storage capacitor is connected with an outputting terminal for a gate driving signal of current stage;

the input sampling unit is connected with a second end of the storage capacitor, and is used for pre-charging the storage capacitor under a control of a gate driving signal of a previous row driving unit stage on the array substrate and enabling the gate driving signal of the current stage to sample an input signal;

the outputting unit is connected with the second end of the storage capacitor, and is used for controlling to output the gate driving signal of the current stage after the input sampling unit accomplishes the pre-charging of the storage capacitor;

the resetting unit is used for resetting the gate driving signal of the current stage under a control of a gate driving signal of the next row driving unit stage on the array substrate, after the outputting unit controls to output the gate driving signal of the current stage.

According to the embodiments of the present disclosure, the input sampling unit comprises a first thin film transistor, the outputting unit comprises a second thin film transistor, and the resetting unit comprises a third thin film transistor and a fourth thin film transistor, wherein:

a gate of the first thin film transistor is connected with the outputting terminal for the gate driving signal of the previous row driving unit stage on the array substrate, a source thereof is connected with a gate of the second thin film transistor, and a drain thereof is connected with a first level outputting terminal of a driving power supply;

a source of the second thin film transistor is connected with a drain of the fourth thin film transistor, and a drain thereof is connected with a first clock signal inputting terminal;

a gate of the third thin film transistor is connected with an outputting terminal for the gate driving signal of the next row driving unit stage on the array substrate, a drain thereof is connected with the source of the first thin film transistor, and a source thereof is connected with a second level outputting terminal of the driving power supply;

a gate of the fourth thin film transistor is connected with a second clock signal inputting terminal, and a source thereof is connected with the second level outputting terminal of the driving power supply;

the first end of the storage capacitor is connected with the source of the second thin film transistor, and the second end thereof is connected with the gate of the second thin film transistor;

the gate of the first thin film transistor is an inputting terminal, the gate of the third thin film transistor is a resetting terminal, and the source of the second thin film transistor is the outputting terminal for the gate driving signal of the current stage.

According to the embodiments of the present disclosure, the first thin film transistor, the second thin film transistor, the third thin film transistor and the fourth thin film transistor are p-type thin film transistors.

According to the embodiments of the present disclosure, the first level outputting terminal of the driving power supply is a low level outputting terminal;

the second level outputting terminal of the driving power supply is a high level outputting terminal.

According to the embodiments of the present disclosure, the first thin film transistor, the second thin film transistor, the third thin film transistor and the fourth thin film transistor are n-type thin film transistors.

According to the embodiments of the present disclosure, the first level outputting terminal of the driving power supply is a high level outputting terminal;

the second level outputting terminal of the driving power supply is a low level outputting terminal.

The embodiments of the present disclosure provide a gate driver on array, which comprises a plurality of the row driving unit stages on the array substrate;

except for the first row driving unit stage on the array substrate, an input terminal of each of the row driving unit stages on the array substrate is connected with an outputting terminal for a gate driving signal of a previous row driving unit stage on the array substrate, respectively;

except for the last row driving unit stage on the array substrate, a resetting terminal of each of the row driving unit stages on the array substrate is connected with the outputting terminal for the gate driving signal of the next row driving unit stage on the array substrate.

The embodiments of the present disclosure provide a display apparatus comprising the gate driver on array described above.

As compared with the prior art, the row driving unit on the array substrate, the gate driver on array and the display apparatus according to the embodiments of the present disclosure are simpler and compacter, may reduce a layout area of wirings in the gate driver on array and realize an AMOLED display with a high resolution.

DETAILED DESCRIPTION

An AMOLED (Active Matrix Organic Light-Emitting Diode) may be embodied mostly by a Low Temperature Poly-Silicon circuit having a higher mobility since it requires a greater current to be driven, as compared with an AMLCD (Active Matrix Liquid Crystal Display). An pixel circuit for the AMOLED generally needs a corresponding compensation structure in order to compensate a problem of a drift in a threshold voltage in a poly-silicon TFT, therefore a structure of the pixel circuit for the AMOLED is more complex and would occupy a larger layout area of wirings correspondingly.

Figure 1:
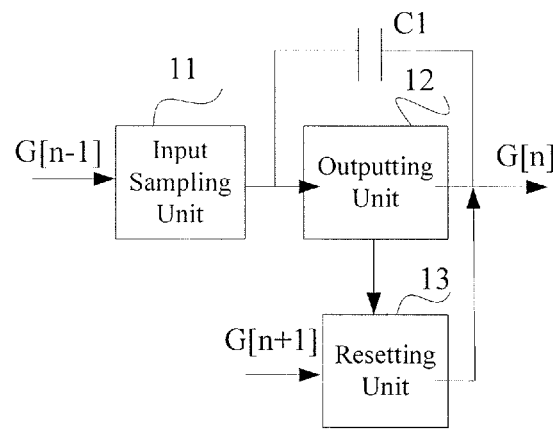
FIG. 1 is a circuit diagram of a row driving unit on array substrate according to a first embodiment of the present disclosure.

As illustrated in FIG. 1, a row driving unit on array substrate according to the first embodiment of the present disclosure comprises an input sampling unit 11, an outputting unit 12, a resetting unit 13 and a storage capacitor C1, wherein:

a first end of the storage capacitor C1 is connected with an outputting terminal for a gate driving signal of current stage;

the input sampling unit 11 is connected with an outputting terminal for the gate driving signal of a previous row driving unit stage on the array substrate and a second end of the storage capacitor C1, and is used for pre-charging the storage capacitor C1 under a control of a gate driving signal of a previous row driving unit stage on the array substrate and enabling the gate driving signal of the current stage to sample an input signal;

the outputting unit 12 is connected with the second end of the storage capacitor C1 and the outputting terminal for the gate driving signal of the current stage, respectively, and is used for controlling to output the gate driving signal of the current stage after the input sampling unit 11 accomplishes the pre-charging of the storage capacitor C1;

the resetting unit 13 is connected with an outputting terminal for the gate driving signal of the next row driving unit stage on the array substrate and the outputting terminal for the gate driving signal of the current stage, respectively, and is used for resetting the gate driving signal of the current stage under a control of a gate driving signal of the next row driving unit stage on the array substrate, after the outputting unit 12 controls to output the gate driving signal of the current stage.

An output signal from the outputting terminal for the gate driving signal of the previous row driving unit stage on the array substrate is G[n−1], an output signal from the outputting terminal for the gate driving signal of the current stage is G[n], and an output signal from the outputting terminal for the gate driving signal of the next row driving unit stage on the array substrate is G[n+1].

Figure 2:
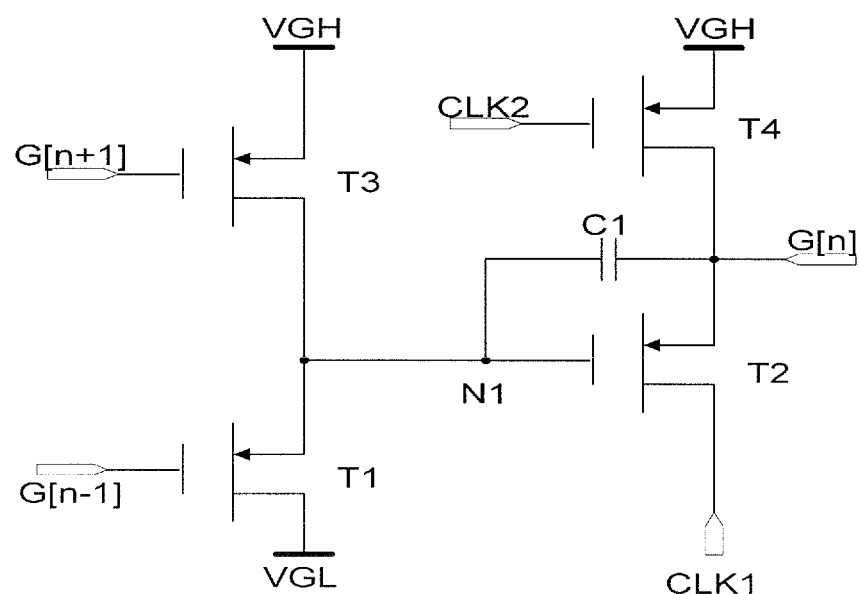
FIG. 2 is a circuit diagram of a row driving unit on array substrate according to a second embodiment of the present disclosure.

FIG. 2 illustrates a circuit diagram of a row driving unit on array substrate according to a second embodiment of the present disclosure, the row driving unit on the array substrate according to the second embodiment of the present disclosure is based on the row driving unit on the array substrate according to the first embodiment of the present disclosure. In the second embodiment of the present disclosure, the input sampling unit 11 comprises a first thin film transistor T1, the outputting unit 12 comprises a second thin film transistor T2, and the resetting unit 13 comprises a third thin film transistor T3 and a fourth thin film transistor T4, wherein:

a gate of the first thin film transistor T1 is connected with the outputting terminal for the gate driving signal of the previous row driving unit stage on the array substrate, a source thereof is connected with a gate of the second thin film transistor T2, and a drain thereof is connected with a low level outputting terminal of a driving power supply;

a source of the second thin film transistor T2 is connected with a drain of the fourth thin film transistor T4, and a drain thereof is connected with a first clock signal inputting terminal;

a gate of the third thin film transistor T3 is connected with an outputting terminal for the gate driving signal of the next row driving unit stage on the array substrate, a drain thereof is connected with the source of the first thin film transistor T1, and a source thereof is connected with a high level outputting terminal of the driving power supply;

a gate of the fourth thin film transistor T4 is connected with a second clock signal inputting terminal, and a source thereof is connected with the high level outputting terminal of the driving power supply;

the first end of the storage capacitor C1 is connected with the source of the second thin film transistor T2, and the second end thereof is connected with the gate of the second thin film transistor T2;

the first thin film transistor T1, the second thin film transistor T2, the third thin film transistor T3 and the fourth thin film transistor T4 are p-type thin film transistors;

the gate of the first thin film transistor T1 is an inputting terminal of the row driving unit on the array substrate according to the second embodiment of the present disclosure, the gate of the third thin film transistor T3 is a resetting terminal of the row driving unit on the array substrate according to the second embodiment of the present disclosure, and the source of the second thin film transistor T2 is the outputting terminal for the gate driving signal of the row driving unit on the array substrate according to the second embodiment of the present disclosure;

wherein, an output voltage from the low level outputting terminal of the driving power supply is VGL, an output voltage from the high level outputting terminal of the driving power supply is VGH, a first clock signal CLK1 is input from the first clock signal inputting terminal, a second clock signal CLK2 is input from the second clock signal inputting terminal, an output signal from the outputting terminal for the gate driving signal of the previous row driving unit stage on the array substrate is G[n−1], an output signal from the outputting terminal for the gate driving signal of the current row driving unit stage on the array substrate is G[n], an output signal from the outputting terminal for the gate driving signal of the next row driving unit stage on the array substrate is G[n+1], and a N1 point is a node connected with the gate of the third thin film transistor T3.

The row driving unit on the array substrate according to the second embodiment of the present disclosure are controlled by the first clock signal CLK1 and the second clock signal CLK2, the output signal G[n−1] from the outputting terminal for the gate driving signal of the previous row driving unit stage on the array substrate is as the input signal of the current row driving unit stage on the array substrate, and the output signal G[n+1] from the outputting terminal for the gate driving signal of the next row driving unit stage on the array substrate is as the reset signal of the current row driving unit on the array substrate.

Figure 3:
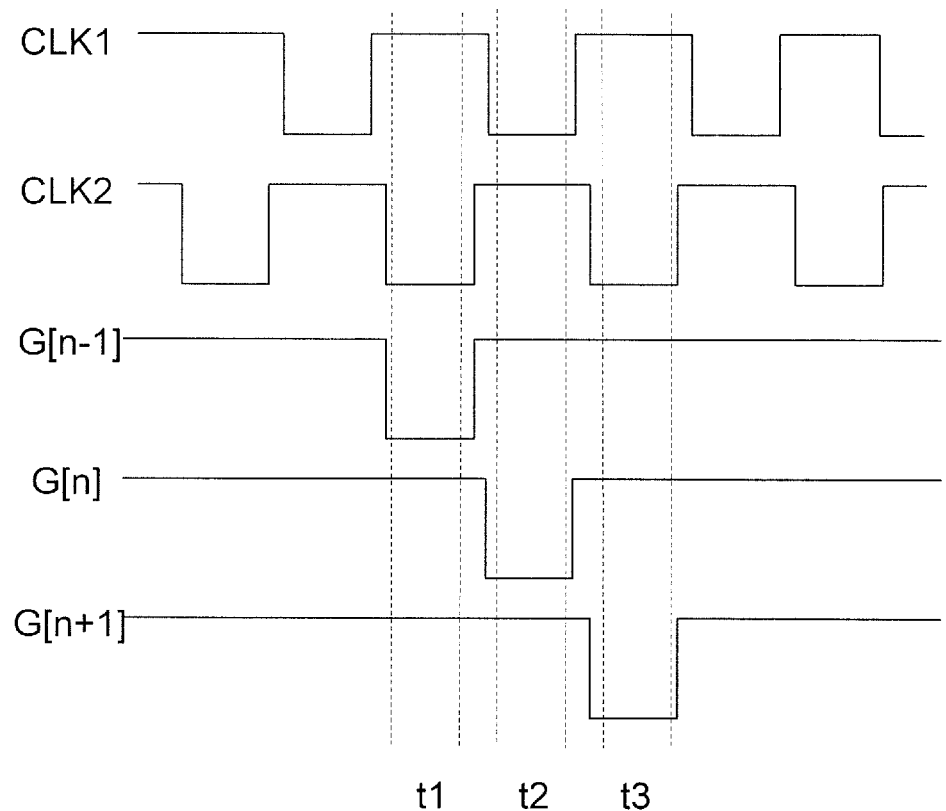
FIG. 3 is a timing chart of respective signals when the row driving unit on the array substrate operates according to the second embodiment of the present disclosure.

FIG. 3 is a timing chart of the first clock signal CLK1, the second clock signal CLK2, G[n−1], G[n] and G[n+1] when the row driving unit on the array substrate operates according to the second embodiment of the present disclosure.

As illustrated in FIG. 3, an operation process of the row driving unit on the array substrate according to the second embodiment of the present disclosure is divided into an input sampling stage t1, an outputting signal stage t2 and a resetting stage t3.

During the input sampling stage t1, the G[n−1] is in the low level, T1 is turned on, and at the same time the G[n+1] is in the high level and T3 is turned off, so a potential at the N1 point is pulled down to VGL+|Vthp| correspondingly at this time; at this moment, the CLK2 is in the low level, the T4 is turned on, the G[n] is in the high level, a potential of the G[n] is VGH, thus the C1 is charged, the gate driving signal of the current stage samples the input signal G[n−1], and a voltage difference across the two ends of the C1 is VGH−VGL−|Vthp|.

During the outputting signal stage t2, both of the G[n−1] and the G[n+1] are in the high level; the potential at the N1 point is remained as VGL+|Vthp| by the C1, the T2 is turned on since a level of the N1 point is in the low level, the CLK2 is in the high level at the same time, the T4 is turned off, thus the G[n] is in the low level at this time.

During the resetting stage t3, the G[n−1] is in the high level, the T1 is turned off, the G[n+1] is in the low level, the T3 is turned on, the level at the N1 point is pulled up to the high level correspondingly, so the T2 is turned off; at the same time the CLK2 is in the low level, so the T4 is turned on, so that the G[n] is pulled up to the high level again and the resetting of the output is implemented.

Wherein, the Vthp is a threshold voltage of the T1.

A switching state of the T4 affects a resetting speed of the G[n]. Since the second clock signal CLK2 is utilized to control the T4, the level of the G[n] may be ensured to be stable and have less fluctuations during unselected stages of G[n], being a gate signal, except for the input sampling stage t1, the outputting signal stage t2 and the resetting stage t3.

Figure 4:
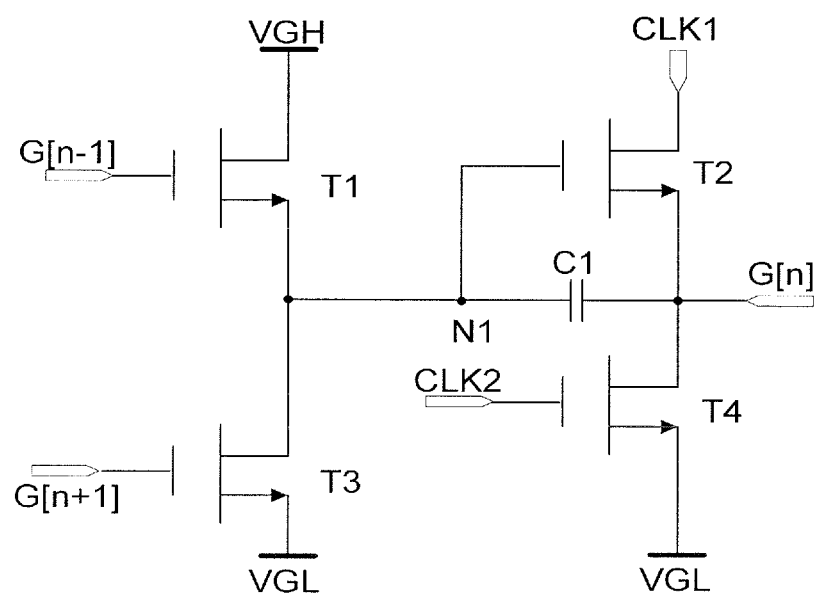
FIG. 4 is a circuit diagram of a row driving unit on array substrate according to a third embodiment of the present disclosure.

FIG. 4 illustrates a circuit diagram of a row driving unit on array substrate according to a third embodiment of the present disclosure, the row driving unit on the array substrate according to the third embodiment of the present disclosure is based on the row driving unit on the array substrate according to the first embodiment of the present disclosure. In the third embodiment of the present disclosure, the input sampling unit 11 comprises a first thin film transistor T1, the outputting unit 12 comprises a second thin film transistor T2, and the resetting unit 13 comprises a third thin film transistor T3 and a fourth thin film transistor T4, wherein:

a gate of the first thin film transistor T1 is connected with the outputting terminal for the gate driving signal of the previous row driving unit stage on the array substrate, a source thereof is connected with a gate of the second thin film transistor T2, and a drain thereof is connected with a high level outputting terminal of a driving power supply;

a source of the second thin film transistor T2 is connected with a drain of the fourth thin film transistor T4, and a drain thereof is connected with a first clock signal inputting terminal;

a gate of the third thin film transistor T3 is connected with an outputting terminal for the gate driving signal of the next row driving unit stage on the array substrate, a source thereof is connected with a low level outputting terminal of the driving power supply, and a drain thereof is connected with the source of the first thin film transistor T1;

a gate of the fourth thin film transistor T4 is connected with a second clock signal inputting terminal, and a source thereof is connected with the low level outputting terminal of the driving power supply;

the first end of the storage capacitor C1 is connected with the source of the second thin film transistor T2, and the second end thereof is connected with the gate of the second thin film transistor T2;

the first thin film transistor T1, the second thin film transistor T2, the third thin film transistor T3 and the fourth thin film transistor T4 are n-type thin film transistors;

the gate of the first thin film transistor T1 is an inputting terminal of the row driving unit on the array substrate according to the third embodiment of the present disclosure, the gate of the third thin film transistor T3 is an resetting terminal of the row driving unit on the array substrate according to the third embodiment of the present disclosure, and the source of the second thin film transistor T2 is the outputting terminal for the gate driving signal of the row driving unit on the array substrate according to the third embodiment of the present disclosure;

wherein, an output voltage from the low level outputting terminal of the driving power supply is VGL, an output voltage from the high level outputting terminal of the driving power supply is VGH, a first clock signal CLK1 is input from the first clock signal inputting terminal, a second clock signal CLK2 is input from the second clock signal inputting terminal, an output signal from the outputting terminal for the gate driving signal of the previous row driving unit stage on the array substrate is G[n−1], an output signal from the outputting terminal for the gate driving signal of the row driving unit on the array substrate according to the third embodiment of the present disclosure is G[n], an output signal from the outputting terminal for the gate driving signal of the next row driving unit stage on the array substrate is G[n+1], and a N1 point is a node connected with the gate of the third thin film transistor T3.

The row driving unit on the array substrate according to the third embodiment of the present disclosure are controlled by the first clock signal CLK1 and the second clock signal CLK2, the output signal G[n−1] from the outputting terminal for the gate driving signal of the previous row driving unit stage on the array substrate is as the input signal of the current row driving unit on the array substrate according to the third embodiment of the present disclosure, and the output signal G[n+1] from the outputting terminal for the gate driving signal of the next row driving unit stage on the array substrate is as the reset signal of the row driving unit on the array substrate according to the third embodiment of the present disclosure.

Figure 5:
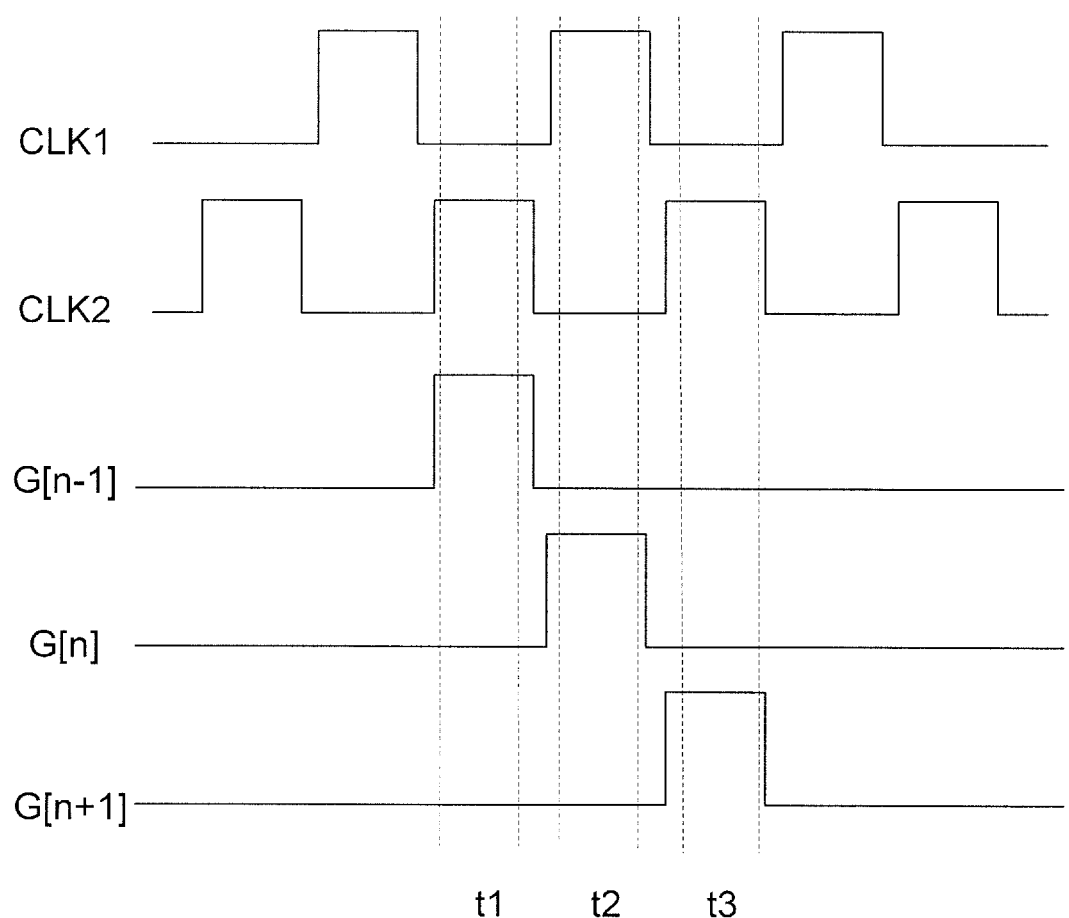
FIG. 5 is a timing chart of respective signals when the row driving unit on the array substrate operates according to the third embodiment of the present disclosure.

FIG. 5 is a timing chart of the first clock signal CLK1, the second clock signal CLK2, G[n−1], G[n] and G[n+1] when the row driving unit on the array substrate operates according to the third embodiment of the present disclosure. An operation principle of the third embodiment of the present disclosure is similar to that of the second embodiment of the present disclosure, so details are omitted herein.

Figure 6:
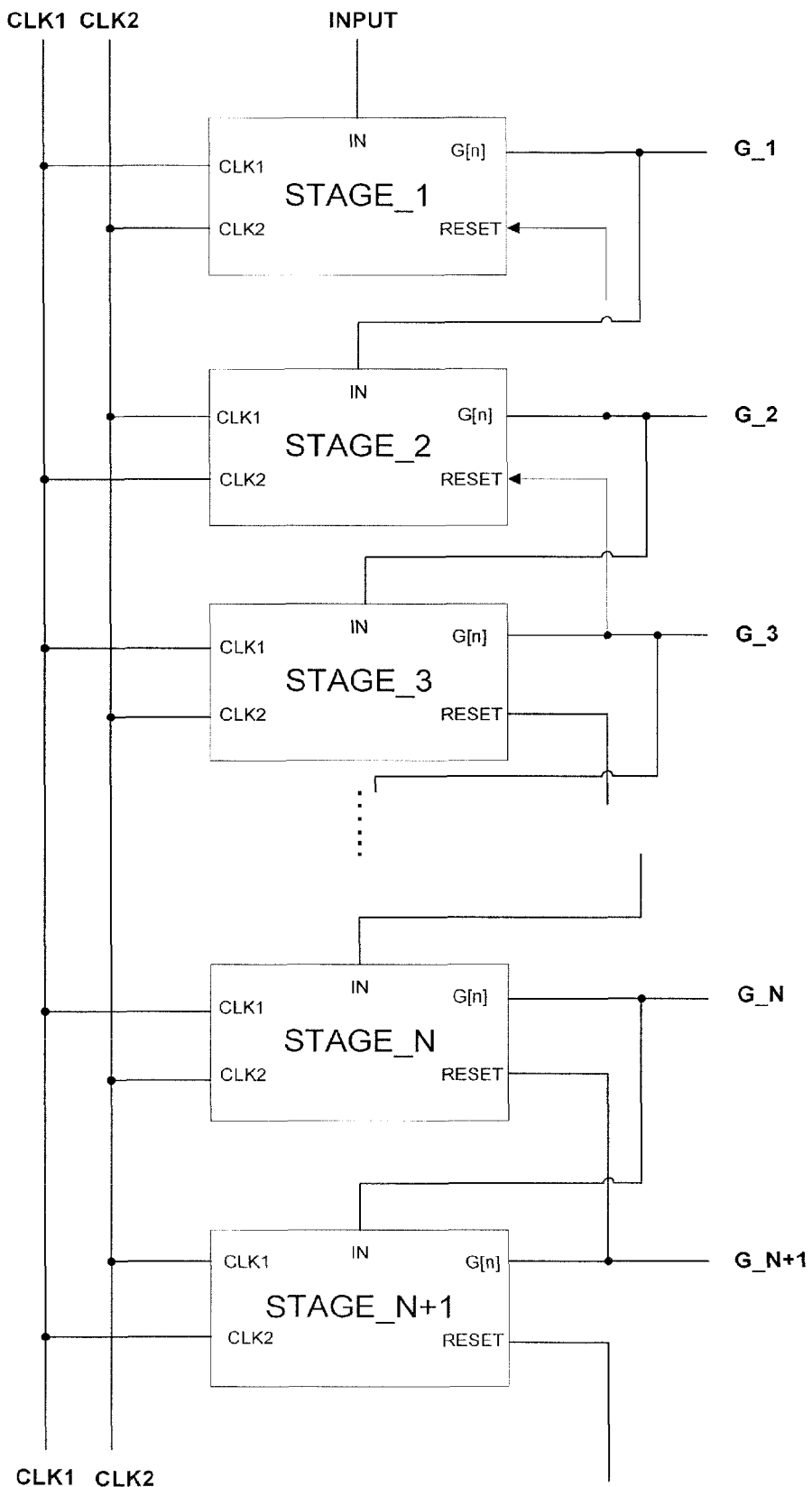
FIG. 6 is a circuit diagram of a gate driver on array according to an embodiment of the present disclosure.

As illustrated in FIG. 6, a gate driver on array according to an embodiment of the present disclosure comprises N+1 row driving unit stages on the array substrate, N is a positive integer;

an inputting terminal of the first row driving unit stage on the array substrate is connected with an input signal INPUT;

except for the first row driving unit stage on the array substrate, an input terminal IN of each of the row driving unit stages on the array substrate is connected with an outputting terminal for a gate driving signal of a previous row driving unit stage on the array substrate, respectively;

except for the last row driving unit stage on the array substrate, a resetting terminal RESET of each of the row driving unit stages on the array substrate is connected with the outputting terminal for the gate driving signal of the next row driving unit stage on the array substrate.

In FIG. 6, G_1, G_2, G_3, G_N and G_N+1 denote an outputting terminal for the gate driving signal of the first row driving unit stage on the array substrate, an outputting terminal for the gate driving signal of the second row driving unit stage on the array substrate, an outputting terminal for the gate driving signal of the third row driving unit stage on the array substrate, an outputting terminal for the gate driving signal of the Nth row driving unit stage on the array substrate, and an outputting terminal for the gate driving signal of the (N+1)th row driving unit stage on the array substrate, respectively.

STAGE_1, STAGE_2, STAGE_3, STAGE_N and STAGE_N+1 denote the first row driving unit stage on the array substrate, the second row driving unit stage on the array substrate, the third row driving unit stage on the array substrate, the Nth row driving unit stage on the array substrate and the (N+1)th row driving unit stage on the array substrate.

The embodiments of the present disclosure provide a gate driver on array, which has a simple structure and a stable performance, and the gate driver on array comprises a plurality of row driving units on the array substrate connected in cascade, wherein each of the row driving unit on the array substrate comprises four thin film transistors and one bootstrap capacitor. The gate driver on array according to the embodiments of the present disclosure is simpler and compacter, it reduce a layout area of wirings in the gate driver on array, and is an optimum selection for realizing an AMOLED display with a high resolution The embodiments of the present disclosure further provide a display apparatus comprising the gate driver on array described above.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A row driving unit on array substrate, comprising a first thin film transistor, a second thin film transistor, a third thin film transistor, a fourth thin film transistor, and a storage capacitor, wherein:
    a first end of the storage capacitor is connected with an outputting terminal for a gate driving signal of current stage;
    a gate of the first thin film transistor is connected with the outputting terminal for the gate driving signal of a previous row driving unit stage on the array substrate, a source thereof is connected with a second end of the storage capacitor, and a drain thereof is connected with a low level outputting terminal of a driving power supply;
    a gate of the second thin film transistor is connected with the source of the first thin film transistor, a source thereof is connected with a drain of the fourth thin film transistor, and a drain thereof is connected with a first clock signal inputting terminal;
    a gate of the third thin film transistor is connected with an outputting terminal for the gate driving signal of a next row driving unit stage on the array substrate, a drain thereof is connected with the source of the first thin film transistor, and a source thereof is connected with a high level outputting terminal of the driving power supply;
    a gate of the fourth thin film transistor is connected with a second clock signal inputting terminal, and a source thereof is connected with the high level outputting terminal of the driving power supply;
    the first end of the storage capacitor is connected with the source of the second thin film transistor, and the second end thereof is connected with the gate of the second thin film transistor;
    the gate of the first thin film transistor is an inputting terminal, the gate of the third thin film transistor is a resetting terminal, and the source of the second thin film transistor is the outputting terminal for the gate driving signal of the current stage;
    wherein the first thin film transistor, the second thin film transistor, the third thin film transistor and the fourth thin film transistor are p-type thin film transistors,
    during an input sampling stage, the inputting terminal is at a low level, the resetting terminal is at a high level, the first clock signal inputting terminal is at a high level and the second clock signal inputting terminal is at a low level, the first thin film transistor is turned on by the low level signal applied to the gate of the first thin film transistor and the fourth thin film transistor is turned on by the low level signal applied to the gate of the fourth thin film transistor, the outputting terminal for the gate driving signal of the current stage outputs a high level;
    during an outputting signal stage, the inputting terminal is at a high level, the resetting terminal is at a high level, the first clock signal inputting terminal is at a low level and the second clock signal inputting terminal is at a high level, the second thin film transistor is turned on by a low level signal applied to the gate of the second thin film transistor, the outputting terminal for the gate driving signal of the current stage outputs a low level;
    during a resetting stage, the inputting terminal is at a high level, the resetting terminal is at a low level, the first clock signal inputting terminal is at a high level and the second clock signal inputting terminal is at a low level, the third thin film transistor is turned on by a low level signal applied to the gate of the third thin film transistor and the fourth thin film transistor is turned on by a low level signal applied to the gate of the fourth thin film transistor, the outputting terminal for the gate driving signal of the current stage outputs a high level.

2. A gate driver on array, which comprises a plurality of the row driving unit stages on the array substrate;
    except for the first row driving unit stage on the array substrate, an input terminal of each of the row driving unit stages on the array substrate is connected with an outputting terminal for a gate driving signal of a previous row driving unit stage on the array substrate, respectively;
    except for the last row driving unit stage on the array substrate, a resetting terminal of each of the row driving unit stages on the array substrate is connected with the outputting terminal for the gate driving signal of a next row driving unit stage on the array substrate,
    wherein the row driving unit on array substrate comprises a first thin film transistor, a second thin film transistor, a third thin film transistor, a fourth thin film transistor, and a storage capacitor, wherein:

a first end of the storage capacitor is connected with an outputting terminal for a gate driving signal of current stage;

a gate of the first thin film transistor is connected with the outputting terminal for the gate driving signal of a previous row driving unit stage on the array substrate, a source thereof is connected with a second end of the storage capacitor, and a drain thereof is connected with a low level outputting terminal of a driving power supply;

a gate of the second thin film transistor is connected with the source of the first thin film transistor, a source thereof is connected with a drain of the fourth thin film transistor, and a drain thereof is connected with a first clock signal inputting terminal;

a gate of the third thin film transistor is connected with an outputting terminal for the gate driving signal of the next row driving unit stage on the array substrate, a drain thereof is connected with the source of the first thin film transistor, and a source thereof is connected with a high level outputting terminal of the driving power supply;

a gate of the fourth thin film transistor is connected with a second clock signal inputting terminal, and a source thereof is connected with the high level outputting terminal of the driving power supply;

the first end of the storage capacitor is connected with the source of the second thin film transistor, and the second end thereof is connected with the gate of the second thin film transistor;

the gate of the first thin film transistor is an inputting terminal, the gate of the third thin film transistor is a resetting terminal, and the source of the second thin film transistor is the outputting terminal for the gate driving signal of the current stage;

wherein the first thin film transistor, the second thin film transistor, the third thin film transistor and the fourth thin film transistor are p-type thin film transistors, during an input sampling stage, the inputting terminal is at a low level, the resetting terminal is at a high level, the first clock signal inputting terminal is at a high level and the second clock signal inputting terminal is at a low level, the first thin film transistor is turned on by the low level signal applied to the gate of the first thin film transistor and the fourth thin film transistor is turned on by the low level signal applied to the gate of the fourth thin film transistor, the outputting terminal for the gate driving signal of the current stage outputs a high level;

during an outputting signal stage, the inputting terminal is at a high level, the resetting terminal is at a high level, the first clock signal inputting terminal is at a low level and the second clock signal inputting terminal is at a high level, the second thin film transistor is turned on by a low level signal applied to the gate of the second thin film transistor, the outputting terminal for the gate driving signal of the current stage outputs a low level;

during a resetting stage, the inputting terminal is at a high level, the resetting terminal is at a low level, the first clock signal inputting terminal is at a high level and the second clock signal inputting terminal is at a low level, the third thin film transistor is turned on by a low level signal applied to the gate of the third thin film transistor and the fourth thin film transistor is turned on by a low level signal applied to the gate of the fourth thin film transistor, the outputting terminal for the gate driving signal of the current stage outputs a high level.

3. A display apparatus comprising the gate driver on array, wherein the gate driver on array comprises a plurality of the row driving unit stages on the array substrate;

except for the first row driving unit stage on the array substrate, an input terminal of each of the row driving unit stages on the array substrate is connected with an outputting terminal for a gate driving signal of a previous row driving unit stage on the array substrate, respectively;

except for the last row driving unit stage on the array substrate, a resetting terminal of each of the row driving unit stages on the array substrate is connected with the outputting terminal for the gate driving signal of a next row driving unit stage on the array substrate, wherein the row driving unit on array substrate comprises a first thin film transistor, a second thin film transistor, a third thin film transistor, a fourth thin film transistor, and a storage capacitor, wherein:

a first end of the storage capacitor is connected with an outputting terminal for a gate driving signal of current stage;

a gate of the first thin film transistor is connected with the outputting terminal for the gate driving signal of a previous row driving unit stage on the array substrate, a source thereof is connected with a second end of the storage capacitor, and a drain thereof is connected with a low level outputting terminal of a driving power supply;

a gate of the second thin film transistor is connected with the source of the first thin film transistor, a source thereof is connected with a drain of the fourth thin film transistor, and a drain thereof is connected with a first clock signal inputting terminal;

a gate of the third thin film transistor is connected with an outputting terminal for the gate driving signal of the next row driving unit stage on the array substrate, a drain thereof is connected with the source of the first thin film transistor, and a source thereof is connected with a high level outputting terminal of the driving power supply;

a gate of the fourth thin film transistor is connected with a second clock signal inputting terminal, and a source thereof is connected with the high level outputting terminal of the driving power supply;

the first end of the storage capacitor is connected with the source of the second thin film transistor, and the second end thereof is connected with the gate of the second thin film transistor;

the gate of the first thin film transistor is an inputting terminal, the gate of the third thin film transistor is a resetting terminal, and the source of the second thin film transistor is the outputting terminal for the gate driving signal of the current stage;

wherein the first thin film transistor, the second thin film transistor, the third thin film transistor and the fourth thin film transistor are p-type thin film transistors, during an input sampling stage, the inputting terminal is at a low level, the resetting terminal is at a high level, the first clock signal inputting terminal is at a high level and the second clock signal inputting terminal is at a low level, the first thin film transistor is turned on by the low level signal applied to the gate of the first thin film transistor and the fourth thin film transistor is turned on by the low level signal applied to the gate of the fourth thin film transistor, the outputting terminal for the gate driving signal of the current stage outputs a high level;

during an outputting signal stage, the inputting terminal is at a high level, the resetting terminal is at a high level, the first clock signal inputting terminal is at a low level and the second clock signal inputting terminal is at a high level, the second thin film transistor is turned on by a low level signal applied to the gate of the second thin film transistor, the outputting terminal for the gate driving signal of the current stage outputs a low level;

during a resetting stage, the inputting terminal is at a high level, the resetting terminal is at a low level, the first clock signal inputting terminal is at a high level and the second clock signal inputting terminal is at a low level, the third thin film transistor is turned on by a low level signal applied to the gate of the third film transistor and the fourth thin film transistor is turned on by a low level signal applied to the gate of the fourth thin film transistor, the outputting terminal for the gate driving signal of the current stage outputs a high level.

* * * * *